United States Patent [19]
Braden et al.

[11] Patent Number: 5,504,372
[45] Date of Patent: Apr. 2, 1996

[54] ADHESIVELY SEALED METAL ELECTRONIC PACKAGE INCORPORATING A MULTI-CHIP MODULE

[75] Inventors: Jeffrey S. Braden, Livermore, Calif.; Jacob Crane, Woodbridge; Deepak Mahulikar, Madison, both of Conn.

[73] Assignee: Olin Corporation, Manteca, Calif.

[21] Appl. No.: 353,741

[22] Filed: Dec. 12, 1994

Related U.S. Application Data

[63] Continuation of Ser. No. 933,270, Aug. 21, 1992, abandoned.

[51] Int. Cl.⁶ ................................................... H01L 23/34
[52] U.S. Cl. .......................... 257/723; 257/706; 257/724
[58] Field of Search .................................. 257/668, 724, 257/723, 725, 708, 720, 706, 707

[56] References Cited

U.S. PATENT DOCUMENTS

| | | |
|---|---|---|
| 3,537,907 | 11/1970 | Wilson . |
| 3,702,427 | 11/1972 | Learn et al. . |
| 3,784,440 | 1/1974 | Grunwald et al. . |
| 4,042,952 | 8/1977 | Kraybill ........................... 257/724 |
| 4,103,318 | 7/1978 | Schwede . |
| 4,105,861 | 8/1978 | Hascoe . |
| 4,461,924 | 7/1984 | Butt . |
| 4,492,730 | 1/1985 | Oishi et al. . |
| 4,495,378 | 1/1985 | Dotzer et al. . |
| 4,506,108 | 3/1985 | Kersch et al. . |
| 4,509,096 | 4/1985 | Baldwin et al. . |
| 4,574,879 | 3/1986 | DeGree et al. . |
| 4,611,745 | 9/1986 | Nakahashi et al. . |
| 4,619,741 | 10/1986 | Minten et al. . |
| 4,649,416 | 3/1987 | Barkowski et al. ................ 257/724 |
| 4,695,515 | 9/1987 | Shirai et al. . |
| 4,767,674 | 8/1988 | Shirai et al. . |
| 4,835,061 | 5/1989 | Ohta et al. . |
| 4,862,323 | 8/1989 | Butt . |
| 4,888,449 | 12/1989 | Crane et al. . |
| 4,899,256 | 2/1990 | Sway-Tin . |
| 4,926,242 | 5/1990 | Itoh et al. . |
| 4,939,316 | 7/1990 | Mahulikar et al. . |
| 4,943,468 | 7/1990 | Gordon et al. . |
| 4,963,697 | 10/1990 | Peterson et al. . |
| 4,997,517 | 3/1991 | Parthasarathi . |
| 5,025,114 | 6/1991 | Braden . |
| 5,044,074 | 9/1991 | Hadwiger et al. . |
| 5,055,967 | 10/1991 | Sukonnik et al. . |
| 5,066,368 | 11/1991 | Pasqualoni et al. . |
| 5,068,708 | 11/1991 | Newman . |
| 5,077,595 | 12/1991 | Iukunaga ........................... 257/723 |
| 5,098,864 | 3/1992 | Mahulikar . |
| 5,121,293 | 6/1992 | Conte . |
| 5,124,783 | 6/1992 | Sawaya ........................... 257/724 |

FOREIGN PATENT DOCUMENTS

| | | | |
|---|---|---|---|
| 56-62351 | 5/1981 | Japan | 257/724 |
| 63-244654 | 10/1988 | Japan | 257/724 |

OTHER PUBLICATIONS

Markstein "Multichip Modules Pursue Wafer Scale Performance" appearing in Electronic Packing & Production, vol. 31, No. 10. Oct. 1991, pp. 40–45.

Hodson "hybrid Circuits Meet the Challenge of Size, Power and Flexibility" appearing in Electronic Packaging & Production, vol. 31, No. 10, Oct. 1991 pp. 60–64.

B. Levine "Multichip Modules Join Arsenal" appearing in Electronic News, vol. 38, No. 1917. Jun. 22, 1992. at pp. 1 and 22.

*Primary Examiner*—Sara W. Crane
*Assistant Examiner*—S. V. Clark
*Attorney, Agent, or Firm*—Gregory S. Rosenblatt

[57] ABSTRACT

There is provided a leadframe assembly for supporting a hybrid circuit. The hybrid circuit is supported by either the base of an electronic package or by a die attach paddle and electrically interconnected to a leadframe by wire bonds. A plurality of semiconductor devices are mounted on the assembly and supported by either metallization pads formed on the hybrid circuit, a dielectric layer of the hybrid circuit, a die attach paddle, a metallic package component or combinations thereof.

10 Claims, 4 Drawing Sheets

5,504,372

ADHESIVELY SEALED METAL ELECTRONIC PACKAGE INCORPORATING A MULTI-CHIP MODULE

This patent application is a continuation of U.S. patent application Ser. No. 07/933,270 entitled "Adhesively Sealed Metal Electronic Package Incorporating a Multi-Chip Module" by Jeffrey S. Braden et al, filed Aug. 21, 1992 (now abandoned).

BACKGROUND OF THE INVENTION

The present invention relates to metal packages for housing a plurality of integrated circuit devices. More particularly, the invention relates to an adhesively sealed metal package having a circuit electrically interconnected to a leadframe and thermally connected to the package base.

Adhesively sealed metal packages are disclosed in U.S. Pat. No. 4,105,861 to Hascoe; U.S. Pat. No. 4,461,924 to Butt and U.S. Pat. No. 4,939,316 to Mahulikar et al, all of which are incorporated by reference in their entireties herein. The packages have a metallic base and cover. A leadframe is disposed between the base and cover and adhesively bonded to both. The leadframe may include a centrally positioned die attach paddle with an integrated circuit device bonded thereto. Bond wires electrically interconnect the device to the leadframe.

One advantage of metal packages over molded plastic packages such as quad flat packs (QFPs) or ceramic packages such as ceramic dual in line packages (CERDIPs), is improved thermal conduction. The metal package removes heat generated during the operation of the device more efficiently than plastic or ceramic packages. The improved heat dissipation is due to both the improved thermal conduction of the metallic components and the ability of the components to disperse heat laterally along all surfaces of the package. The improved thermal dissipation permits encapsulation of more complex and higher power integrated circuit devices than is possible with plastic or ceramic packages.

As the integrated circuit devices become more complex, more electrical interconnections with external circuitry and with other integrated circuit devices are required. The leadframe which electrically interconnects the device to external circuitry is usually manufactured from a copper base alloy having a thickness of from about 0.13 mm to about 0.51 mm (5–20 mils). Due to stamping and etching constraints, the minimum width of each lead, as well as the spacing between leads is about equal to the thickness of the leadframe. As a result, there is a limit to the number of leads which may approach the integrated circuit device.

An additional limitation is lead length. As the integrated circuit devices become more powerful and operate at higher operating speeds, the time for an electronic signal to travel from one device to the next limits the speed of the electronic assembly (such as a computer). When a single device is encapsulated in each electronic package, the electronic signal must travel from the device, through a bond wire, through a leadframe, through a circuit trace on a printed circuit board, through a second leadframe, through a second bond wire and then to a second discretely housed device.

One approach to increase the density of interconnections to an integrated circuit device and to reduce the time required for an electric signal to travel from device to device is a hybrid circuit. A hybrid circuit has conductive circuit traces formed on a dielectric substrate. Discrete integrated circuit devices are electrically interconnected to the circuit traces such that a plurality of devices may all be located on a single substrate. The hybrid circuit can then be encapsulated in a metal, plastic or ceramic package typically referred to as a multi-chip module. Examples of multi-chip modules, as well as a description of their development may be found in an article by Hodson entitled "Circuits Meet the Challenge of Size, Power and Flexibility" which appeared in the October, 1991 issue of ELECTRONIC PACKAGING AND PRODUCTION and is incorporated by reference in its entirety herein.

Multi-chip modules address the problem of increasing the density of integrated circuit devices. However, the dielectric substrates, which are typically silicon or alumina, are not ideal for the conduction of heat from the multi-chip module. While aluminum nitride has been proposed as an alternate and will provide better thermal conduction, the material is brittle and hard to fabricate.

Applicants have determined that a low cost, high thermal conductivity multi-chip module may be formed using a metallic substrate. The metal, preferably copper, aluminum or an alloy thereof, has better thermal conductivity than conventional silicon and alumina substrates and also better thermal conductivity than Kovar which is frequently used to house the circuits.

SUMMARY OF THE INVENTION

Accordingly, it is an object of the invention to provide a multi-chip module having high thermal conductivity. It is a feature of the invention that a circuit, either rigid or flexible, and either single or multi-layer, is adhesively bonded to a metallic substrate with an inorganic dielectric layer disposed therebetween. A plurality of integrated circuit devices are electrically interconnected either to that circuit or to a leadframe positioned around the perimeter of the circuit. Yet another feature of the invention is that the devices may be attached to any one of the metallic substrate, inorganic dielectric layer, the circuit traces or an intervening die attach paddle.

It is an advantage of the invention that the multi-chip modules have high thermal dissipation capabilities. Another advantage of the invention is that the inorganic dielectric layer electrically isolates the integrated circuit devices, the adhesively bonded circuit and the leadframe from the metallic package components of the multi-chip module.

In accordance with the invention, there is provided a leadframe assembly for electrically interconnecting a plurality of semiconductor devices. The assembly includes a leadframe with inner lead ends defining a central region and a hybrid circuit. The hybrid circuit is made up of a dielectric substrate which supports circuit traces. The hybrid circuit contains a first means for electrically interconnecting at least a portion of the circuit traces to the inner lead ends of the leadframe and a second means for supporting a plurality of discrete semiconductor devices.

In a second embodiment of the invention, the leadframe assembly is encapsulated within metallic package components or is encased in a plastic molding resin.

The above stated objects, features and advantages, as well as others, will become more apparent from the specification and drawings which follow.

DESCRIPTION OF THE PREFERRED EMBODIMENT

The following definitions apply throughout this application:

Hybrid Circuit—a circuit which combines several different components in a single package. Typically, the hybrid circuit will include circuit traces supported on a dielectric substrate and a plurality of discrete semiconductor devices.

Multi-Chip Module—an electronic package for housing one or more hybrid circuits.

Figure 1:
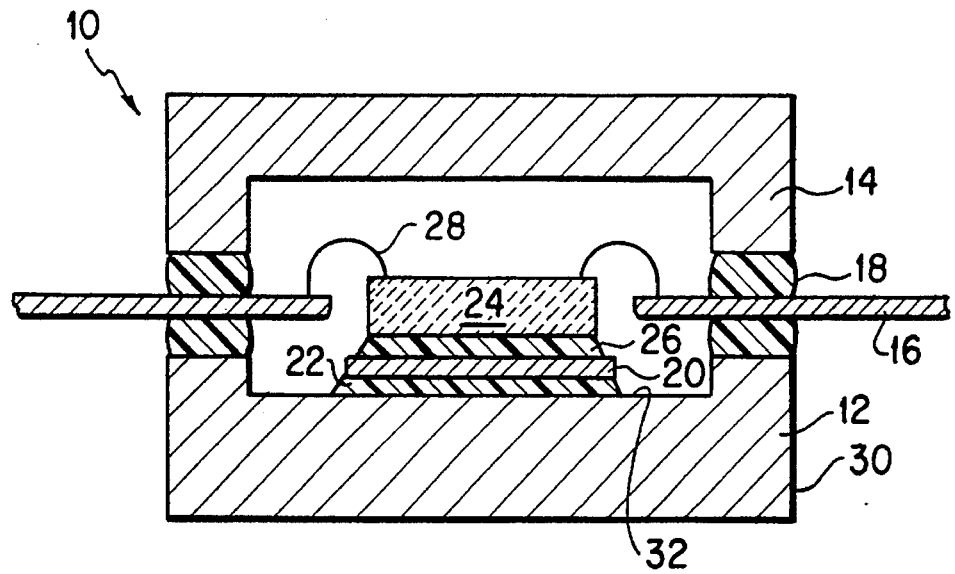
FIG. 1 shows in cross sectional representation an adhesively sealed metal package as known from the prior art.

FIG. 1 shows in cross sectional representation an adhesively sealed metal package 10 as described in U.S. Pat. No. 4,939,316. The package 10 has a metallic base component 12 and a cover component 14. A leadframe 16 is disposed between the metallic base component 12 and the cover component 14 and adhesively bonded to both by a polymer adhesive 18.

A die attach paddle 20 which is typically formed from the same metal as the leadframe is bonded to the metallic base component 12 by a thermally conductive pad attach adhesive 22. An integrated circuit device 24, typically a silicon based semiconductor integrated circuit, is bonded to the die attach paddle 20 by a die attach 26 which may be either a low melting temperature solder or a polymer adhesive. Small diameter bond wires 28 electrically interconnect the leadframe 16 to the semiconductor device 24.

In the electronic package of U.S. Pat. No. 4,939,316, both the metallic base component 12 and the cover component 14 are formed from aluminum or an aluminum base alloy. At least a portion of the surfaces 30 of the package components is coated with an anodization layer which provides both corrosion resistance and electrical isolation. Dependent on whether the surface 32 of the interior of the metallic base component 12 is anodized or not, the semiconductor device 24 may be electrically interconnected to the metallic base component 12 or electrically isolated therefrom.

Figure 2:
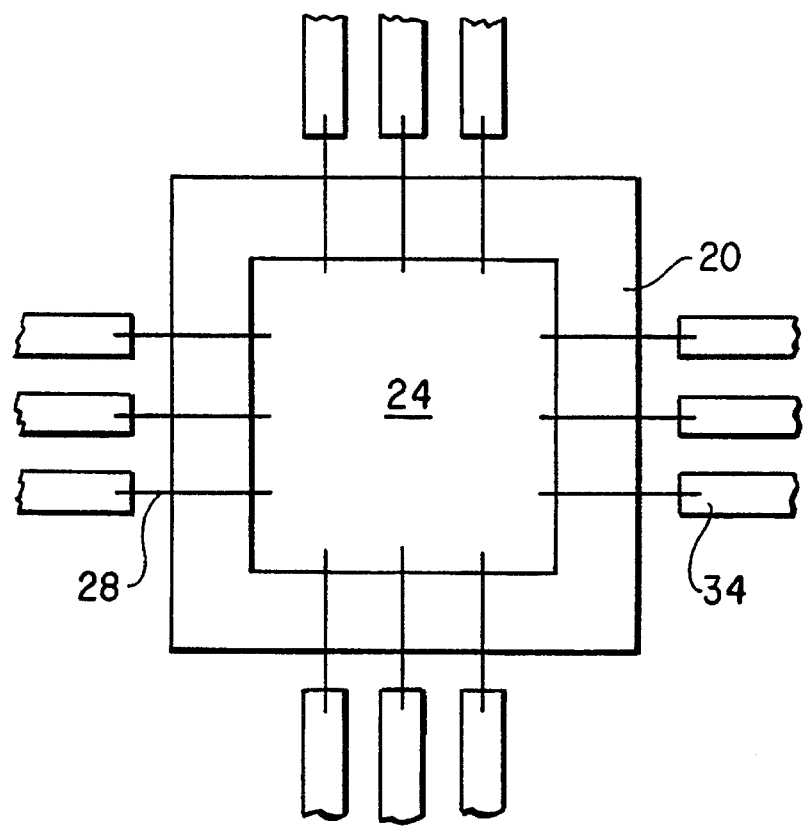
FIG. 2 shows in top planar view an integrated circuit device bonded to a centrally positioned die attach paddle as known from the prior art.

FIG. 2 shows in top planar view the positioning of the semiconductor device 24 on a die attach paddle 20 as known from the prior art. The die attach paddle 20 is disposed within a central region defined by the inner lead tips 34 of the leadframe. The inner lead tips 34 may approach the semiconductor device 24 from all four directions as in a quad configuration; from two sides (dual in-line configuration); or from a single side (single in-line configuration). Small diameter bond wires 28 electrically interconnect the semiconductor device 24 to the inner lead ends 34 of the leadframe. These bond wires 28 are generally small diameter, typically on the order of 0.025 mm (1 mil), wires of copper, aluminum, gold or alloys thereof and are thermosonically bonded to the inner lead ends 34 of the leadframe and metallized input/output pads on the electrically active face of the semiconductor device 24. Alternatively, thin strips of copper foil as utilized in tape automated bonding (TAB) may also form the interconnection between the semiconductor device 24 and the inner lead ends 28.

Due to the stamping and etching constraints discussed above, a limited number of inner lead ends 34 may approach the semiconductor device 24. Spacing the inner lead ends 34 farther from the semiconductor device 24 will permit the inclusion of additional leads, but this is not a desired solution. As the bond wire length increases, the operating speed of the device decreases. Longer bond wires are also prone to sag which may cause an electrical short circuit. These problems are solved by the first embodiment of Applicants' invention which is illustrated in top planar view in FIG. 3.

Figure 3:
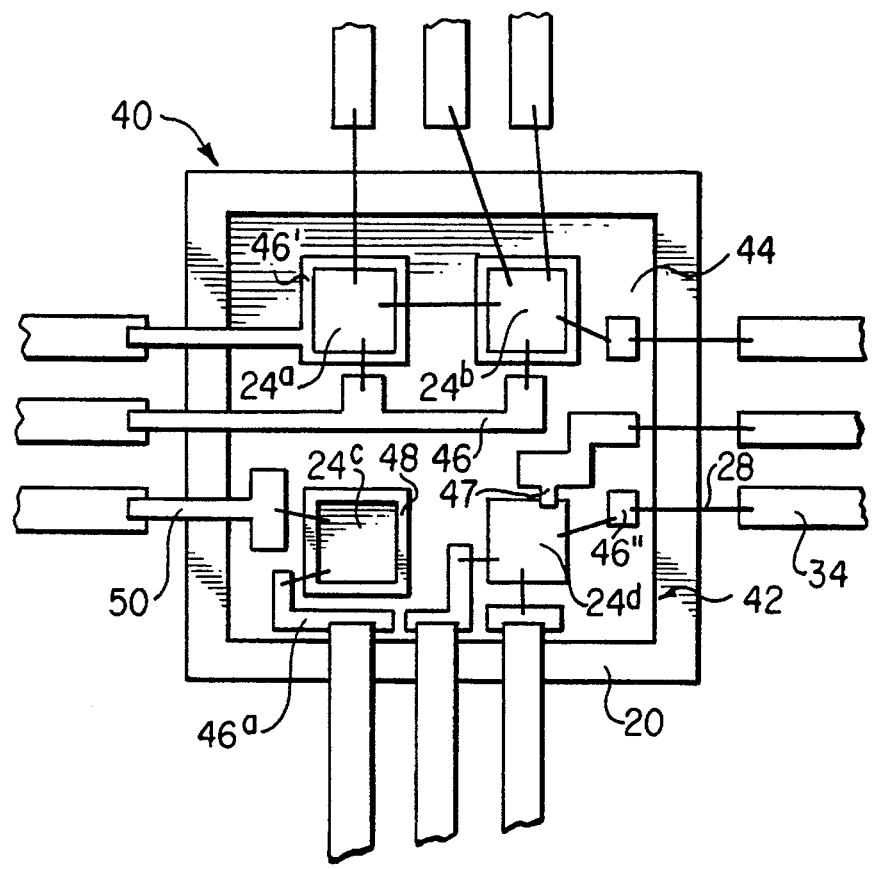
FIG. 3 shows in top planar view a hybrid circuit mounted on a die attach paddle and electrically interconnected to a leadframe in accordance with a first embodiment of the invention.

FIG. 3 shows a leadframe assembly 40 for the electrical interconnection of a hybrid circuit 42. The hybrid circuit 42 comprises a dielectric substrate 44 which supports a plurality of circuit traces 46. The dielectric substrate 44 may be formed from any suitable insulative material, either organic or inorganic, and may be either rigid or flexible. Generally, if the semiconductor devices $24^a$, $24^b$, $24^c$, $24^d$ are mounted on the dielectric substrate as shown for semiconductor devices $24^1$, $24^b$, $24^d$, a relatively thin, on the order of 0.025–0.076 mm (1–3 mils), dielectric substrate is preferred to facilitate the conduction of heat from the semiconductor devices. If the semiconductor device $24^c$ is mounted in an aperture 48 formed through the dielectric substrate 44 directly to either the package base (not shown) or a die attach paddle 20, the thickness of the dielectric substrate becomes less important. Similarly, if the dielectric substrate 44 is formed from an insulative material having good thermal conductivity such as aluminum nitride or silicon carbide, the thickness of the substrates is less important.

Typical materials for the dielectric substrate include ceramics such as alumina ($Al_2O_3$), aluminum nitride (AlN) and silicon carbide (SIC) The dielectric substrate may also be an organic such as polyimide or an epoxy, either filled or unfilled. Other substrate materials include silicon which has good thermal conductivity and a coefficient of thermal expansion exactly matching that of silicon based semiconductor devices 24.

A plurality of circuit traces 46 are formed on the dielectric substrate 44 by conventional means. For materials able to withstand high temperatures such as ceramic and silicon, a desired pattern may be formed from a metallic paste by a process such as screen printing or direct writing. The metallic paste is then fired to drive off organic binders leaving behind a metallized circuit pattern. When the dielectric substrate 44 is organic based, such as a polyimide, a metallic film may be deposited by electroless plating or by lamination of a thin layer of metallic foil. Selective etching, such as photolithography, forms the described circuit patterns.

The circuit traces 46 can electrically interconnect semiconductor devices $24^a$, $24^b$. Other circuit traces 46' can form a metallization pad for attachment of an integrated circuit device $24^a$. A first means is provided to electrically interconnect circuit traces to the inner lead ends 34 of the leadframe. Such first means include a metallized interposer pad 46" to shorten the length of bond wires extending between the inner lead ends 34 of the leadframe and a semiconductor device $24^d$.

The circuit traces can form a metallic foil 47 bonded to semiconductor device $24^d$ in TAB format or form a series of discrete bonding sites for direct soldering to input/output sites on the integrated circuit device ("flip chip bonding").

The circuit traces can also form another first means for electrical interconnection or an extension 50 for direct bonding to the inner lead ends 34. The circuit traces $46^a$ can form bonding pads for the direct attachment of inner lead ends 34 to the hybrid circuit 42. Attachment may be by any suitable electrically conductive means such as thermosonic bonding, thermal compression bonding, soldering and conductive adhesives. Preferred are low melting solders such as gold tin and lead tin alloys.

Figure 4:
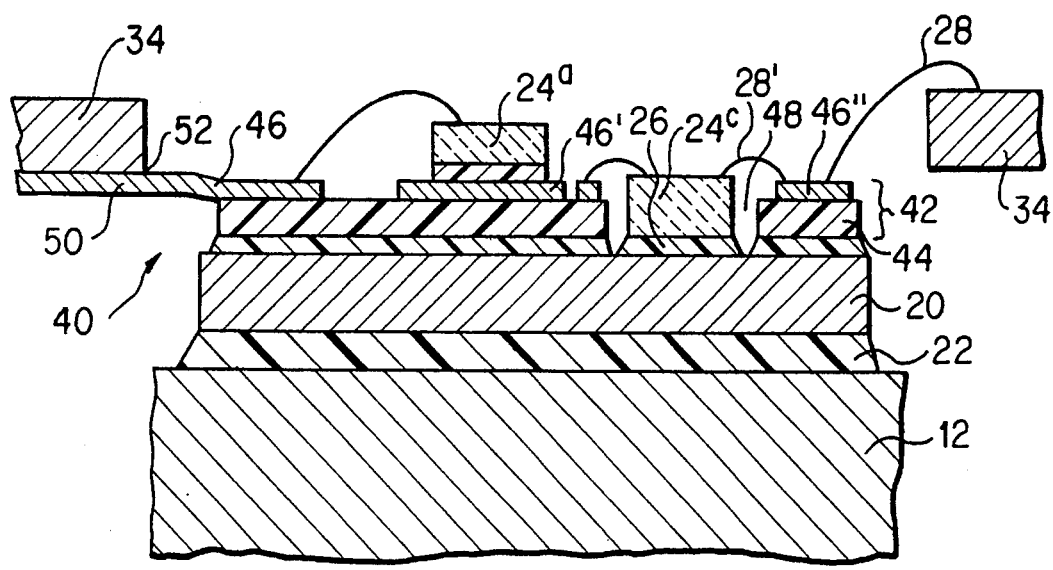
FIG. 4 shows in cross sectional representation a multi-chip module incorporating a centrally positioned die attach paddle.

Attachment of the leadframe assembly 40 to the metallic base component 12 of an adhesively sealed metal package is illustrated in cross-sectional representation in FIG. 4. FIG. 4 shows two semiconductor devices $24^a$, $24^c$ bonded to a die attach paddle 20 by means of a hybrid circuit 42. Semiconductor device $24^a$ is directly bonded to a metallized circuit trace 46' bonding pad. As more clearly shown in FIG. 3, metallized bonding pad 46' may electrically interconnect the backside of the semiconductor device $24^a$ to the leadframe or to other semiconductor devices.

Referring back to FIG. 4, the semiconductor device $24^c$ can extend through an aperture 48 in the hybrid circuit 42 for direct bonding to the die attach paddle 20. Attachments of the semiconductor devices $24^a$, $24^c$ to either the hybrid circuit 42 or the die attach paddle 20 may be by any conventional means such as an epoxy or a low temperature melting solder. If electrical interconnection between the backside of the semiconductor device and the bonding site is desired, either a metallic solder such as the gold tin eutectic or a lead tin composition may be used. Alternatively, a conductive adhesive such as a silver filled epoxy may be utilized.

If, as illustrated in FIG. 3, the integrated circuit device $24^d$ is directly bonded to the dielectric substrate 44, suitable die attach materials include polymer adhesives and, when the dielectric substrate 44 is a high temperature substrate such as ceramic or silicon, a sealing glass may be utilized. Additionally, metals which alloy with the substrate, for example, for a silicon substrate, gold, may be utilized.

Referring back to FIG. 4, two methods of interconnecting the hybrid circuit 42 to an external leadframe are illustrated. Small diameter bond wires 28 electrically interconnect the inner lead ends 34 to a bonding pad 46" which is then electrically interconnected through a second bond wire 28' to a semiconductor device $24^c$. This interposer circuit structure reduces the length of the bond wire required to interconnect the leadframe to the semiconductor device $24^c$.

Alternatively, foil extensions 50 may extend from the circuit metallizations 46 for direct interconnection to inner lead ends 34. Bond 52 between the foil extension 50 and the inner lead end 34 may be by any suitable means which maintains electrical conductivity between the foil extension and the inner lead end such as a conductive adhesive, a solder or thermal compression or thermosonic bonding. Most preferred are low melting temperature solders such as gold-tin or lead-tin alloys.

The leadframe assembly 40 is then bonded to a metallic base component 12 by a pad attach adhesive 22. The pad attach adhesive 22 may be any suitable metallic or polymer adhesive such as a solder or epoxy. When a polymer adhesive is utilized, it is desirable to increase the thermal conductivity of the adhesive to improve thermal conduction. The pad attach adhesive 22 may be a thermosetting epoxy filled with a thermally conductive material such as silver, graphite or alumina. One particularly advantageous aspect of this embodiment is illustrated by the direct bonding of semiconductor device $24^c$ to die attach paddle 20. While all the advantages of the hybrid circuit 42 are obtained, the semiconductor device $24^c$ is in direct contact with the metallic die attach paddle 20. Heat generated by the semiconductor device does not pass through a thermally insulating dielectric substrate 44 to reach the thermally conductive die attach paddle 20.

Figure 5:
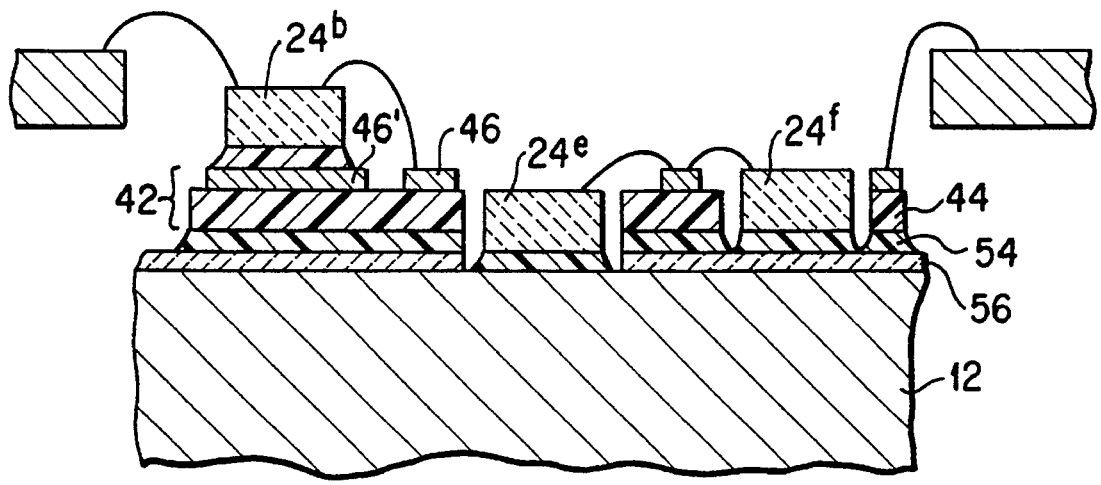
FIG. 5 shows in cross sectional representation a hybrid circuit mounted on a metallic package component in accordance with a second embodiment of the invention.

A second embodiment of the invention is illustrated in cross sectional representation in FIG. 5. The hybrid circuit 42 is bonded such as by an adhesive 54 directly to the metallic base component 12. While the dielectric substrate 44 provides electrical isolation between the circuit traces 46 and the metallic base component 12, it is desirable to provide an inorganic dielectric layer 56 between the metallic base component and the hybrid circuit 42. When the metallic substrate is aluminum or an aluminum base alloy, the inorganic dielectric layer may constitute a layer of anodized aluminum formed by any suitable anodization process, such as anodic immersion in a solution containing sulfuric acid and sulfosalicylic acid which provides an integral black color for aluminum alloys of the 3xxx series (aluminum containing up to 1.5 weight percent manganese) as disclosed in U.S. Pat. No. 5,066,368 to Pasqualoni et al which is incorporated by reference in its entirety herein.

Where the metallic base component 12 is copper or a copper base alloy, the inorganic dielectric layer 56 may constitute a thin refractory oxide layer formed in situ, by coating with a second material and forming the inorganic dielectric layer from that second material or by direct bonding of an insulating layer. The "in situ" process involves forming the inorganic dielectric layer 56 directly from the constituents of the copper base alloy as more fully described in U.S. Pat. No. 4,862,323 by Butt. Preferred copper alloys contain from about 2 to about 12 percent by weight aluminum. One particularly preferred alloy is copper alloy C6381 containing 2.5 to 3.1% aluminum, 1.5 to 2.1% silicon and the balance copper. The copper base alloy is oxidized by heating in gases having a low oxygen content. One suitable gas is 4% hydrogen, 96% nitrogen and a trace of oxygen released from a trace of water mixed in the gas.

If the copper base alloy is not suited for in situ formation of the inorganic dielectric layer 56, the copper base alloy may be clad with a metal or alloy capable of forming the refractory oxide as disclosed in U.S. Pat. No. 4,862,323. Alternatively, as disclosed in U.S. Pat. No. 4,888,449 to Crane et al, the copper base substrates may be coated with a second metal, such as nickel, and a refractory oxide formed on the coating layer.

Another suitable technique is disclosed in U.S. Pat. No. 4,495,378 to Dotzer et al. An iron or copper substrate is coated with a metallic flash of copper or silver. Aluminum is then electrolytically deposited on the flash and anodized to form an inorganic dielectric layer.

Yet another method of forming an inorganic dielectric layer 56 on a metallic base component 12 is disclosed in U.S. Pat. No. 4,611,745 to Nakahashi et al. An aluminum nitride substrate is soldered to a copper layer using a braze material comprising silver and a reactive metal selected from the group consisting of titanium, zirconium and hafnium.

Whatever method is used for the formation of the inorganic dielectric layer 56, it is preferred that the formation of the layer is selective, for example, when an electrolytic process is used such as anodization, a plater's tape may mask selected areas to prevent formation of the layer in those regions. By selective deposition, semiconductor device 24$^e$ may be bonded directly to the metallic base component 12 to maximize thermal conduction from the electronic device. Alternatively, the semiconductor device 24$^f$ may be bonded to the inorganic dielectric layer. The choice between embodiments 24$^e$ and 24$^f$ depends on whether electrical isolation from the metallic base component 12 is desired.

As with the preceding embodiment, the semiconductor device 24$^b$ may be bonded to a metallization pad 46' formed from the circuitry traces 46.

Figure 6:
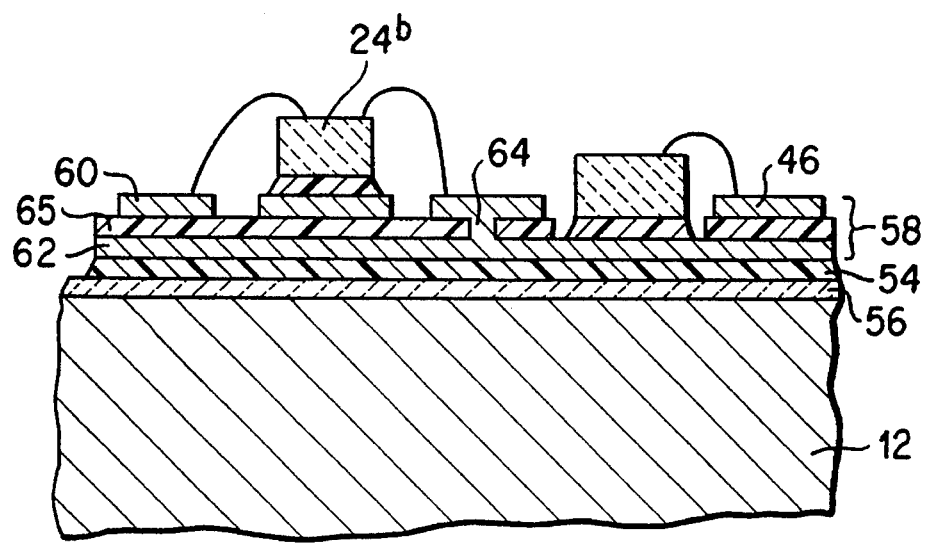
FIG. 6 shows in cross sectional representation a hybrid circuit mounted on a metallic package component and incorporating a multi-layer circuit in accordance with a third embodiment of the invention.

FIG. 6 illustrates in cross sectional representation a third embodiment of the invention. In this embodiment, the hybrid circuit comprises a multi-layer hybrid circuit 58 having a plurality of metallic layers and at least one dielectric layer separating the metallic layers. Circuit traces 46 may be formed on the first metallic layer 60 as well as the second metallic layer 62. Alternatively, one of the metallic layers may comprise a solid sheet for use as a ground or power plane. An electrically conductive via 64 formed by any means known in the art, for example, deposition of a carbon black dispersion on the walls of a non-conductive via followed by electrolytic or electroless plating of a conductive material such as copper as disclosed in U.S. Pat. No. 4,619,741 to Minten et al, may be utilized. The conductive vias 64 allow electrical interconnection of the second metallic layer to input/output sites on the face of the semiconductor device 24$^b$. The semiconductor devices may be bonded to either of the metallic layers, to the intervening dielectric layer 64, to a die attach paddle (not shown), to the inorganic dielectric layer 56 or to the metallic base component 12.

While FIG. 6 shows a multi-layer hybrid circuit 58 comprising two metal layers and a single dielectric layer, there may be any number of metallic layers and intervening dielectric layers. Additionally, while FIG. 6 illustrates an embodiment in which the multi-layer hybrid circuit 58 is directly bonded to an inorganic dielectric layer 56 formed on the surface of a metallic base component 12, it is within the scope of the invention for a die attach paddle to be disposed between the multi-layer hybrid circuit and the metallic base component.

Figure 7:
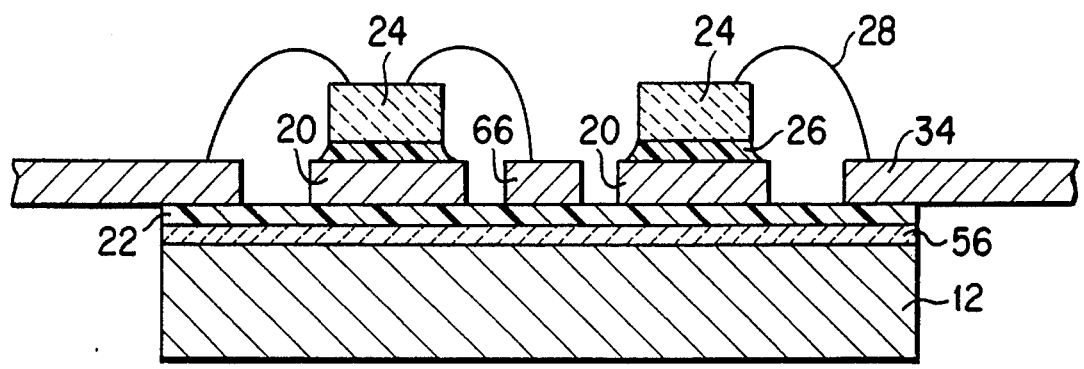
FIG. 7 shows in cross sectional representation a multi-chip module with a leadframe adhesively bonded to a metallic package component in accordance with a fourth embodiment of the invention.

FIG. 7 illustrates in cross sectional representation a fourth embodiment of the invention. The metallic base component 12 has an inorganic dielectric layer 56 formed on at least one surface. A thermally conductive, electrically insulating pad attach adhesive 22 such as a thermosetting polymer, thermoplastic polymer or sealing glass bonds both the inner lead ends 34 of the leadframe and a plurality of die attach paddles 20 to the metallic base component. Bond wires 28 electrically interconnect the semiconductor devices 24 to the leadframe and to metallic circuit runs 66 which may constitute inner lead fingers or metallic runs electrically isolated from the leadframe.

The semiconductor devices 24 are bonded to die attach paddles 20 with die attach adhesive 26. The die attach paddles are then adhesively bonded to the inorganic dielectric layer by a thermally conductive pad attach adhesive 22.

Figure 8:
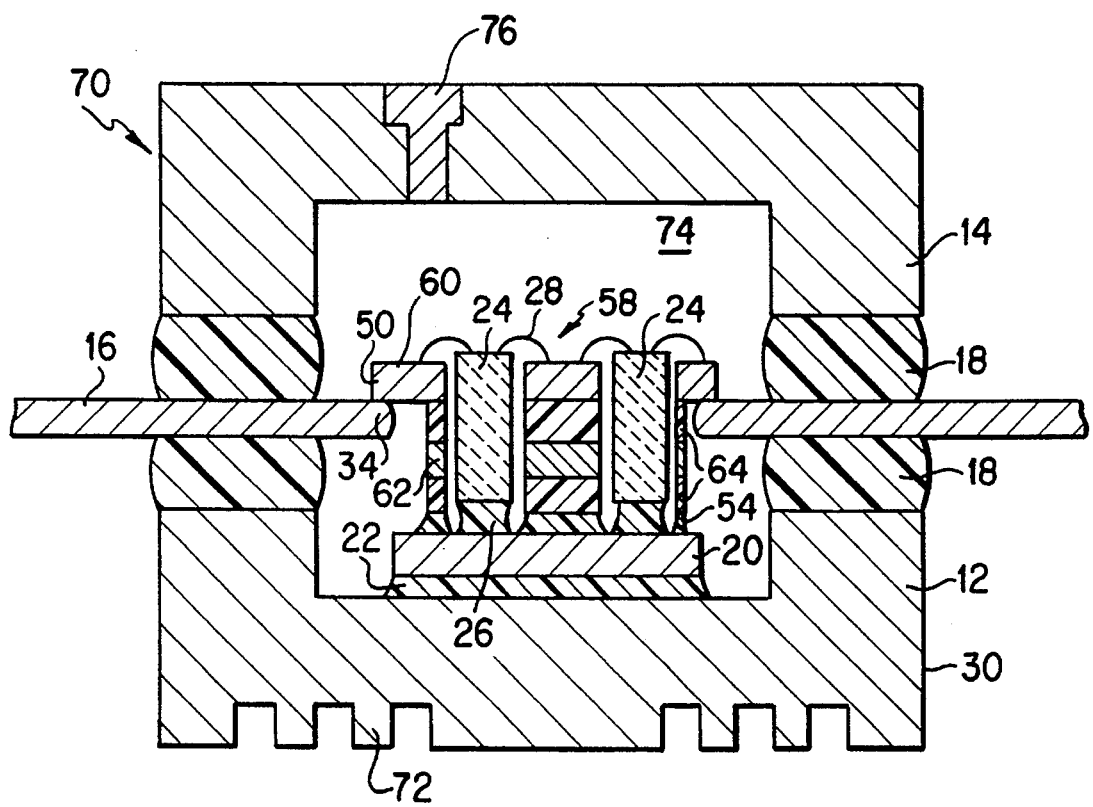
FIG. 8 shows in cross-sectional representation a hybrid circuit encapsulated in an adhesively sealed metal package.

The leadframe assemblies illustrated in FIGS. 3–7 may be encapsulated in any suitable electronic package, such as plastic, ceramic or metal. FIG. 8 illustrates in cross sectional representation a preferred embodiment in which a multi-layer hybrid circuit is encapsulated within a metal electronic package 70. All elements illustrated in FIG. 8 are not drawn to scale to better show the structure of the hybrid circuit 58. As a result, certain elements, notably semiconductor devices 24, are distorted in the Figure.

The package has a metallic base component 12 formed from a thermally conductive material such as an aluminum base alloy. Fins 72 may be formed in the metallic base component 12 to increase thermal dissipation. A multi-layer hybrid circuit 58 having first 60 and second 62 metallic layers and intervening dielectric layers 64 is bonded by adhesive 54 to a die attach paddle 20. Thermally conductive pad attach adhesive 22 bonds the multi-layer hybrid circuit and the die attach paddle 20 to the metallic base component 12. The surface 30 of the base component 12 is preferably coated with an inorganic dielectric layer to improve electrical isolation and corrosion resistance. The first metallic layer 60 contains cantilever foil extensions 50 for direct bonding to the inner leads 34 of leadframe 16. A plurality of semiconductor devices 24 are bonded to the die attach paddle 20. Bond wires 28 electrically interconnect the semiconductor devices 24 to circuit traces formed in the first metallic layer. Electrical interconnection to the second metallic layer may also be incorporated through the use of electrically conductive vias (not shown).

A cover component 14 and a metallic base component 12 are bonded to the leadframe 16 by a polymer adhesive 18. If the polymer adhesive 18 is a thermosetting epoxy or another adhesive requiring heat for cure, air in the package cavity 74 will expand during heating. To prevent the change in cavity volume from creating pressure on the polymer adhesive 18 and causing an inadequate seal, a vent hole 76 is preferably formed in the cover component 14. The vent hole 76 is subsequently sealed, for example, by adhesively sealing a small metal slug to complete the multi-chip module 70.

While FIG. 8 illustrates an embodiment in which a leadframe assembly is encapsulated within a metal package, it is within the scope of the invention to encapsulate any of the above-described leadframe assemblies in a molded plastic package, a ceramic package or a glass sealed metal package.

The patents and publications cited in this application are intended to be incorporated by reference.

It is apparent that there has been provided in accordance with this invention a leadframe assembly incorporating a hybrid circuit which fully satisfies the objects, means and advantages set forth hereinbefore. While the invention has been described in combination with specific embodiments thereof, it is evident that many alternatives, modifications and variations will be apparent to those skilled in the art in light of the foregoing description. Accordingly, it is intended to embrace all such alternatives, modifications, and variations as fall within the spirit and broad scope of the claims.

We claim:

1. An electronic package encapsulating a plurality of integrated circuit devices, comprising:

a metallic base component formed from a copper or a copper base alloy coated with a second metal selected from the group consisting of nickel and aluminum, said metallic base component at least partially coated with a refractory oxide formed from said second metal;

a hybrid circuit assembly having a dielectric substrate supporting circuit traces and containing a first means electrically interconnecting said integrated circuit devices to external circuitry and a second means supporting said plurality of integrated circuit devices; and a third means bonding said hybrid circuit to said metallic base component.

2. An electronic package encapsulating a plurality of integrated circuit devices, comprising:

a metallic base component formed from a copper base alloy containing from about 2% to about 12% by weight aluminum and at least partially coated with an alumina refractory oxide layer formed in situ;

a hybrid circuit assembly having a dielectric substrate supporting circuit traces and containing a first means electrically interconnecting said integrated circuit devices to external circuitry and a second means supporting said plurality of integrated circuit devices; and a third means bonding said hybrid circuit to said metallic base component.

3. The electronic package of claim 1 wherein said third sealing means is a thermosetting polymer filled with a material to increase thermal conductivity.

4. The electronic package of claim 3 wherein said second means is selected from the group consisting of bonding of said plurality of integrated circuit devices to metallized pads formed on said dielectric substrate, bonding said plurality of integrated circuit devices to said dielectric substrate, bonding said plurality of integrated circuit devices to said inorganic dielectric layer, and bonding said plurality of integrated circuit devices to said metallic base component and combinations thereof.

5. The electronic package of claim 4 wherein said first means is selected from the group consisting of metallized interposer pads, metallic foil extending from said dielectric substrate to said inner leads and metallized bonding pads for direct attachment to said inner leads.

6. The electronic package of claim 5 wherein a polymer molding resin surrounds at least a portion of said leadframe and of said metallic base component.

7. The electronic package of claim 2 wherein said third sealing means is a thermosetting polymer filled with a material to increase thermal conductivity.

8. The electronic package of claim 7 wherein said second means is selected from the group consisting of bonding of said plurality of integrated circuit devices to metallized pads formed on said dielectric substrate, bonding said plurality of integrated circuit devices to said dielectric substrate, bonding said plurality of integrated circuit devices to said inorganic dielectric layer, and bonding said plurality of integrated circuit devices to said metallic base component and combinations thereof.

9. The electronic package of claim 8 wherein said first means is selected from the consisting of metallized interposer pads, metallic foil extending from said dielectric substrate to said inner leads and metallized bonding pads for direct attachment to said inner leads.

10. The electronic package of claim 9 wherein a polymer molding resin surrounds at least a portion of said leadframe and of said metallic base component.

* * * * *